(12) United States Patent
Calvignac et al.

(10) Patent No.: US 6,681,364 B1
(45) Date of Patent: Jan. 20, 2004

(54) CYCLIC REDUNDANCY CHECK FOR PARTITIONED FRAMES

(75) Inventors: Jean Louis Calvignac, Cary, NC (US); Clark Debs Jeffries, Durham, NC (US); Fabrice Jean Verplanken, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/405,669

(22) Filed: Sep. 24, 1999

(51) Int. Cl.$^7$ ............................................. H03M 13/00
(52) U.S. Cl. ..................................................... 714/776
(58) Field of Search ............................... 714/776, 752, 714/757, 758, 701, 763, 779, 762, 707, 769, 818; 370/401, 410, 400, 466, 340, 463, 419, 439, 458, 392, 475; 340/825.5, 825.52; 712/35, 26, 33; 704/500, 201; 375/264, 270, 240.26; 348/426.1, 433.1; 709/243

(56) References Cited

U.S. PATENT DOCUMENTS

| 3,872,430 A | 3/1975 | Boudreau et al. ......... 340/146.1 |
| 4,238,852 A | * 12/1980 | Iga et al. ....................... 360/32 |
| 4,593,393 A | 6/1986 | Mead et al. .................... 371/37 |
| 4,623,920 A | * 11/1986 | Dufresne et al. ............ 380/240 |
| 4,712,215 A | 12/1987 | Joshi et al. ..................... 371/37 |

(List continued on next page.)

OTHER PUBLICATIONS

Sharp, D.W. et al. (Detection of variable message lengths for NATO Improved Link Eleven using CRC codes; IEEE, On page(s): 910–914 vol. 3; Nov. 4–7, 1991).*

Glaise, R.J. et al. (Fast CRC calculation; IEEE, On page(s): 602–605; Oct. 3–6, 1993).*

Shuaib, K. et al. (A cell loss padding technique for the transport of MPEG-2 transport stream over ATM/AAL; IEEE, On page(s): 450–454; Dec. 8–10, 1997).*

W. Stallings, "Data and Computer Communications", 5th Ed., Prentice Hall, New Jersey, 1997, pp. 166–171.

*Primary Examiner*—Albert Decady
*Assistant Examiner*—Guy Lamarre
(74) *Attorney, Agent, or Firm*—Bracewell & Patterson (57) ABSTRACT

An improved method and system for generating a frame check sequence. A multiple-bit data string, M, is received in which M is of the form:

$$a_n b_n c_n d_n a_{n-1} b_{n-1} c_{n-1} d_{n-1} \ldots a_2 b_2 c_2 d_2 a_1 b_1 c_1 d_1.$$

M is thereafter parsed into multiple subframes of the form:

$$a_n a_{n-1} a_{n-2} \ldots a_2 a_1;$$

$$b_n b_{n-1} b_{n-2} \ldots b_2 b_1;$$

$$c_n c_{n-1} c_{n-2} \ldots c_2 c_1;$$

and $$d_n d_{n-1} d_{n-2} \ldots d_2 d_1.$$

The subframes are padded with zeros resulting in subframes of the form:

$$a_n 000 a_{n-1} 000 a_{n-2} 000 \ldots a_2 000 a_1 000;$$

$$0 b_n 000 b_{n-1} 000 b_{n-2} 00 \ldots 0 b_2 000 b_1 00;$$

$$00 c_n 000 c_{n-1} 000 c_{n-2} 0 \ldots 00 c_2 000 c_1 00;$$

and $$000 d_n 000 d_{n-1} 000 d_{n-2} \ldots 000 d_2 000 d_1.$$

A partial check sum is then generated for each of the multiple subframes. Finally, each of the partial check sums are added together such that a frame check sequence for M is obtained.

14 Claims, 4 Drawing Sheets

U.S. PATENT DOCUMENTS

| | | | | |
|---|---|---|---|---|
| 4,723,243 A | | 2/1988 | Joshi et al. | 371/37 |
| 5,008,879 A | * | 4/1991 | Fischer et al. | 370/401 |
| 5,122,875 A | * | 6/1992 | Raychaudhuri et al. | 348/390.1 |
| 5,168,356 A | * | 12/1992 | Acampora et al. | 375/240.15 |
| 5,251,215 A | | 10/1993 | Dravida et al. | 370/94.1 |
| 5,280,476 A | | 1/1994 | Kojima et al. | 370/60.1 |
| 5,282,215 A | | 1/1994 | Hyodo et al. | 371/42 |
| 5,313,454 A | | 5/1994 | Bustini et al. | 370/13 |
| 5,325,372 A | | 6/1994 | Ish-Shalom | 370/37.6 |
| 5,351,243 A | * | 9/1994 | Kalkunte et al. | 340/825.52 |
| 5,361,266 A | * | 11/1994 | Kodama et al. | 714/758 |
| 5,379,297 A | | 1/1995 | Glover et al. | 370/60.1 |
| 5,410,546 A | | 4/1995 | Boyer et al. | 371/37.1 |
| 5,450,399 A | | 9/1995 | Sugita | 370/60.1 |
| 5,452,330 A | | 9/1995 | Goldstein | 375/257 |
| 5,778,013 A | * | 7/1998 | Jedwab | 714/807 |
| 5,790,842 A | | 8/1998 | Charles et al. | 395/559 |
| 5,793,427 A | | 8/1998 | Mills et al. | 348/391 |
| 5,951,707 A | * | 9/1999 | Christensen et al. | 714/752 |
| 2001/0000221 A1 | * | 4/2001 | Chen et al. | 375/340 |

* cited by examiner

CYCLIC REDUNDANCY CHECK FOR PARTITIONED FRAMES

BACKGROUND OF THE INVENTION

1. Technical Field

The present invention relates in general to managing communications networks, and in particular, to a method and system for providing increased flexibility in processing data packets. More particularly, the present invention relates to a method and system for computing a frame check sequence (FCS) for a partitioned data packet. Still more particularly, the present invention relates to implementing Cyclic Redundancy Checks (CRCs) utilizing the inherent flexibility of modulo-2 arithmetic with no carries to provide a Cyclic Redundancy Check (CRC) that is adaptable with existing data processing structures and methods.

2. Description of the Related Art

CRC is a well known method for determining the presence of errors in digital transmissions in which discrete units of data, known as packets are delivered. The fundamental principle upon which CRC is based can be expressed equivalently in one of three ways. First, CRC can be described in terms of division of binary numbers. Second, as described by Boudreau et al. in U.S. Pat. No. 3,872,430, CRC may be performed utilizing a division of polynomials. Third, the utility in implementing CRCs is often realized by designing special check circuits in which Exclusive Or (XOR) and other elementary binomial operands generate frame check numbers for use during CRC.

Several types of packet-oriented data transmission systems are currently available. Token Ring, Ethernet, Asynchronous Transfer Mode (ATM), and Synchronous Optical Network (SONET) are examples of such systems which employ error detection and correction techniques such as CRC. When an information packet (sometimes referred to as a "frame" or "cell") is delivered from a source node to a destination node the receiver will utilize CRC to verify integrity of the transmission. To verify an accurate and successful transmission of an n-bit data packet, M, in accordance with conventional CRC methodologies requires two fundamental steps. First, a divisor P having n+1 bits is selected. For example, and with reference to Spragins p. 279, the divisor utilized in accordance with the IEEE 802 standard is the 33-bit number known as "CRC-32", as follows (the dot "." is for visual convenience only):

10000010.01100000.10001110.11011011.1.

The next step is to append n 0-bits to the end of the data sequence M. This is equivalent to multiplying M (regarding M as a binary number) by $2^n$. Data sequence M is then divided by P utilizing modulo-2 arithmetic with, no carries and the remainder, R, is the Frame Check Sequence (FCS) of M. This FCS is then appended to the end (right) of M without the added 0-bits to produce the frame to be transmitted T. If T is correctly transmitted and then divided by P, the remainder is the n-bit number having all zero entries.

Various methods for employing CRC and computing a FCS are well known to those skilled in the art and for a further explanation of conventional CRC methods, reference is made herein to Boudreau et al. U.S. Pat. No. 3,872,430 Stallings, pp. 164–171, and Spragins, Hammond, Pawlikowski, p.279. These references provide a more detailed explanation of CRC calculations and are incorporated herein by reference.

Computation of a FCS for a lengthy data string is cumbersome and hardware intensive. It is therefore often desirable to divide the computation of a FCS for a data packet into several subcomputations which are faster and which impose a lesser degree of hardware overhead. Several techniques are known for performing such CRC computations on subdivided portions of the original data packet. U.S. Pat. No. 5,410,546 (Boyer et al.) and U.S. Pat. No. 5,325,372 (Ish-Shalom), describe one such approach in which partial CRC remainders (adjustment codes) are stored in a table. In this manner, the complete CRC check sequence (sometimes referred to as "check sum") may be reconstructed utilizing a software implementation that constructs a FCS from the partial CRC remainders. Such methods may result in lower computation time but do not necessarily reduce hardware and software overhead. In addition, these "table lookup" methods do not support multiple interleaved data streams and are therefore insufficient when utilized with asynchronous systems such as Asynchronous Transfer Mode (ATM).

It can therefore be appreciated that a need exists for an improved CRC computation methodology that capitalizes on existing logic structures to calculate and subsequently combine partial CRCs to form a packet CRC. Such a method and system, if implemented would reduce the overhead required for generating check sequences that provides the flexibility inherent in utilizing partial CRCs.

SUMMARY OF THE INVENTION

It is therefore an object of the invention to provide an improved method and system for managing data communications.

It is another object of the invention to provide a method and system for providing increased flexibility in processing data packets.

It is still another object of the invention provide a method and system for computing a frame check sequence (FCS) for a partitioned data packet.

It is a further object of the invention to provide a method and system for implementing Cyclic Redundancy Checks (CRCs) utilizing the inherent flexibility of modulo-2 arithmetic to provide a CRC that is adaptable with existing data processing structures and methods.

The above and other objects are achieved as is now described. An improved method and system for generating a frame check sequence are disclosed. In the preferred implementation, a multiple-bit data string, M, is received in which M is of the form:

$a_n b_n c_n d_n a_{n-1} c_{n-1} d_{n-1} \ldots a_2 b_2 c_2 d_2 a_1 b_1 c_1 d_1$.

M is thereafter parsed into multiple subframes of the form:

$a_n a_{n-1} a_{n-2} \ldots a_2 a_1$;

$b_n b_{n-1} b_{n-2} \ldots b_2 b_1$;

$c_n c_{n-1} c_{N-2} \ldots c_2 c_1$;

and $d_n d_{n-1} d_{n-2} \ldots d_2 d_1$.

The subframes are padded with zeros resulting in subframes of the form:

$a_n 000 a_{n-1} 000 a_{n-2} 000 \ldots a_2 000 a_1 000$;

$0 b_n 000 b_{n-1} 000 b_{n-2} 00 \ldots 0 b_2 000 b_1 00$;

$00 c_n 000 c_{n-1} 000 c_{n-2} 0 \ldots 00 c_2 000 c_1 0$;

and $$000d_n000d_{n-1}000d_{n-2}\ldots000d_2000d_1.$$

A partial check sum is then generated for each of the multiple subframes. Finally, each of the partial check sums are added together such that a frame check sequence for M is obtained. In this manner, the sum of the partial check sums is guaranteed to be the same as the check sum for the original complete data packet.

BRIEF DESCRIPTION OF THE DRAWINGS

The novel features believed characteristic of the invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

DETAILED DESCRIPTION OF PREFERRED EMBODIMENT

The computations required for obtaining or verifying a FCS require the use of substantial sequential and combinatorial logic. Data registers of at least 32 bits are typically required for performing the arithmetic operations entailed in computing a FCS. Telecommunications nodes such as switches and bridges are often designed or constructed so that incoming or outgoing data packets are divided into subparts before being processed within the node or released for transmission. The present invention introduces a new method and system for computing a CRC code, referred to interchangeably as a frame check sequence (FCS), by regularly partitioning the original data packet into subframes and obtaining partial FCSs therefrom. The partial FCSs are subsequently added to obtain the CRC for the original data packet. The steps required accomplish this are explained with reference to FIGS. 1 through 3 below.

Figure 1:
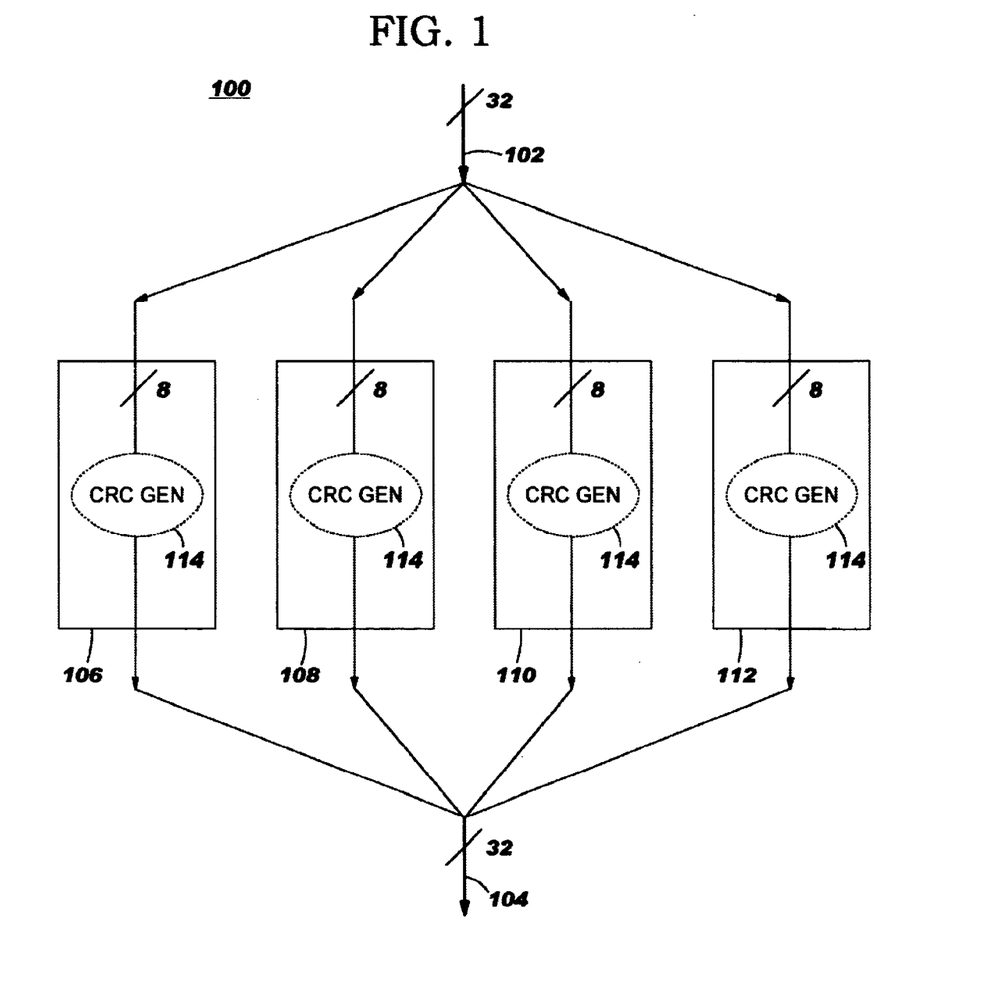
FIG. 1 depicts a CRC generator in accordance with the teachings of the present invention.

With reference now to the figures, and in particular with reference to FIG. 1, there is depicted a CRC generator 100 in accordance with the teachings of the present invention. As seen in FIG. 1, CRC generator 100 is comprised of an input link 102, an output link 104, and four intermediate data ports 106, 108, 110, and 112. Within each of data ports 106, 108, 110, and 112, is a CRC computation module 114. It is within CRC computation module 114 that a Frame Check Sequence (FCS) is generated. As utilized herein, a "frame" is a packet of information transmitted as a single unit in either asynchronous or synchronous communications systems. A FCS is a binary numeric string utilized as the check number within CRC.

As seen in FIG. 1, an original 32-bit data entity may be divided into four subframes. The 32 bits of the original packet passing through input link 102 will be divided equally among each of the resultant subframes passing through data ports 106, 108, 110, and 112. FCS generator 114 will then operate upon each subframe in accordance with CRC conventional computation methods to produce a partial FCS within each port. These partial FCSs are then delivered to output link 104 where they are recombined to form the complete FCS as described in greater detail hereinbelow.

Figure 2:
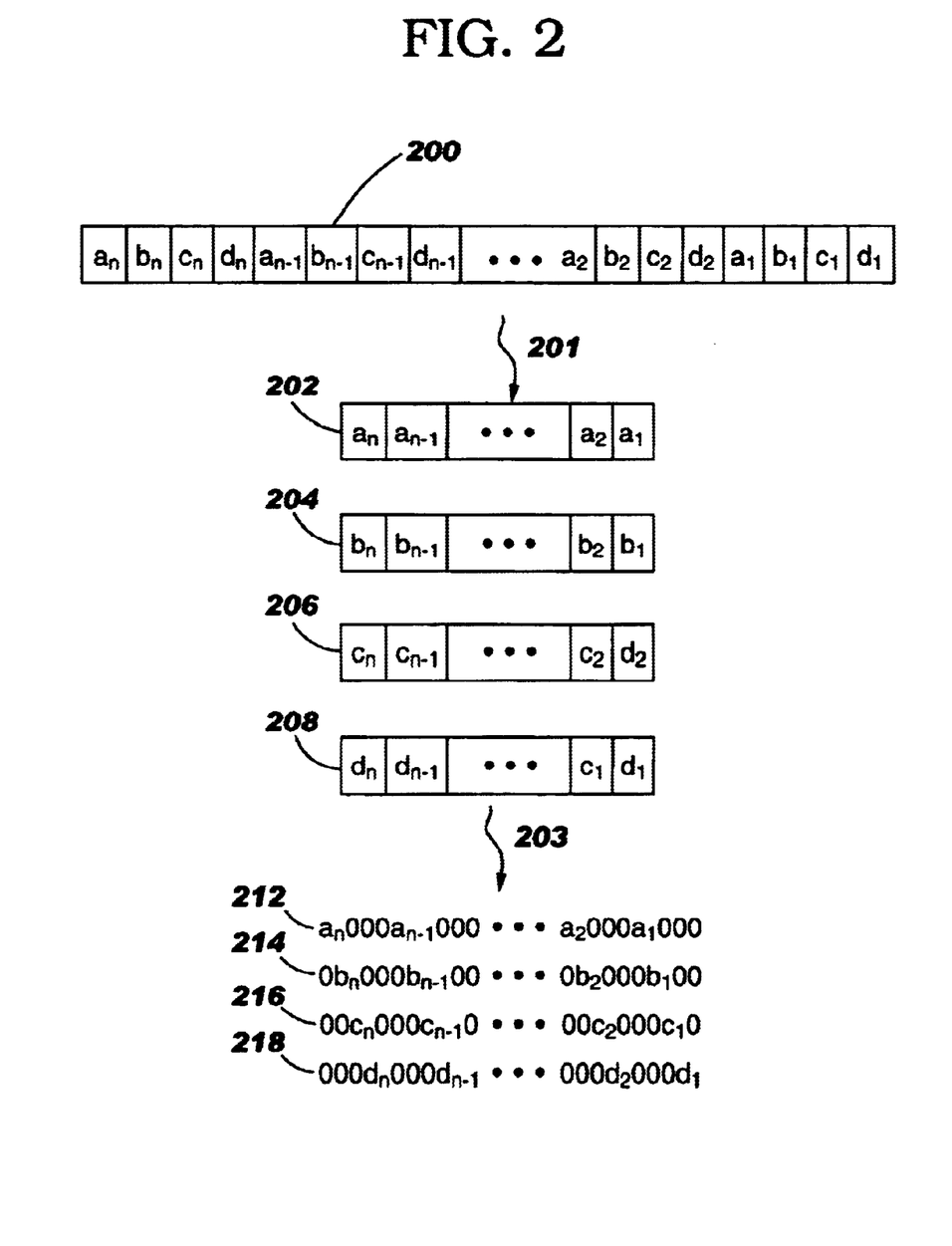
FIG. 2 illustrates a data packet partitioned in accordance with the method and system of the present invention.

With reference now to FIG. 2, there is illustrated a data packet 200 partitioned into subframes 202, 204, 206, and 208 in accordance with the method and system of the present invention. For clarity of explanation, the individual bits comprising data packet 200 have been labeled in a manner illustrative of how data packet 200 is partitioned in accordance with the present invention to form subframes 202, 204, 206, and 208. Data packet 200 represents a conventional data packet that may assume many possible forms depending on the type of system being employed. ATM and similar "connection-oriented" technologies transmits data as fixed-length cells of 53 bytes. A typical ATM cell includes a 5-byte header and 48-byte data payload. In contrast, "connection-less" standards such as Ethernet and Token Ring, transfer data packets of varying length. The improved CRC method and system of the present invention may be implemented utilizing any of a variety of such data packets.

In order to verify integrity of data transmission of data packet 200, a FCS for data packet 200 must be generated and stored for future comparisons. After being initially generated, this number is transmitted as an attachment to data packet 200. The node receiving data packet 200 will then recompute the FCS in accordance with CRC convention and compare the newly computed value to the FCS received with data packet 200. If the newly computed version conforms with the FCS received, then correct transmission of data packet 200 has been verified. If there is a disparity, an error is indicated and the data packet may be retransmitted. Utilizing this approach, transmission errors in the information fields and header or flag fields of a data packet are detected.

As illustrated in FIG. 2, subframes 202, 204, 206, and 208, are padded with zeros to form padded subframes 212, 214, 216, and 218 respectively, which are equal in length to the original data packet 200. In order to generate a FCS for data packet 200, each of padded subframes 212, 214, 216, and 218 are divided utilizing modulo-2 arithmetic with no carries by a predetermined divisor P (not depicted). The divisor, P, is a binary numeric string that may be comprised of any of several non-zero binary combinations, without departing from the scope or spirit of the present invention. Four remainders R1, R2, R3, and R4 will result from the division of padded subframes 212, 214, 216, and 218 by P. These remainders are the partial FCSs which must thereafter be added together in order to obtain the final FCS for data packet 200. Reference is made to Appendix A which provides a comprehensive explanation of the modulo-2 arithmetic computations utilized to derive the remainders and final FCS.

In an important feature of the present invention, the FCS obtained by adding remainders R1, R2, R3, and R4 will be equal to the FCS that would be obtained by dividing the entire original data packet 200 by P. A theorem in support of this result is provided and explained in greater detail in Appendix A. This feature of the present invention may be advantageously applied in the context of computing CRC codes for asynchronous data transfer technologies such as ATM in which multiple, regularly interleaved data streams must be accommodated.

Figure 3:
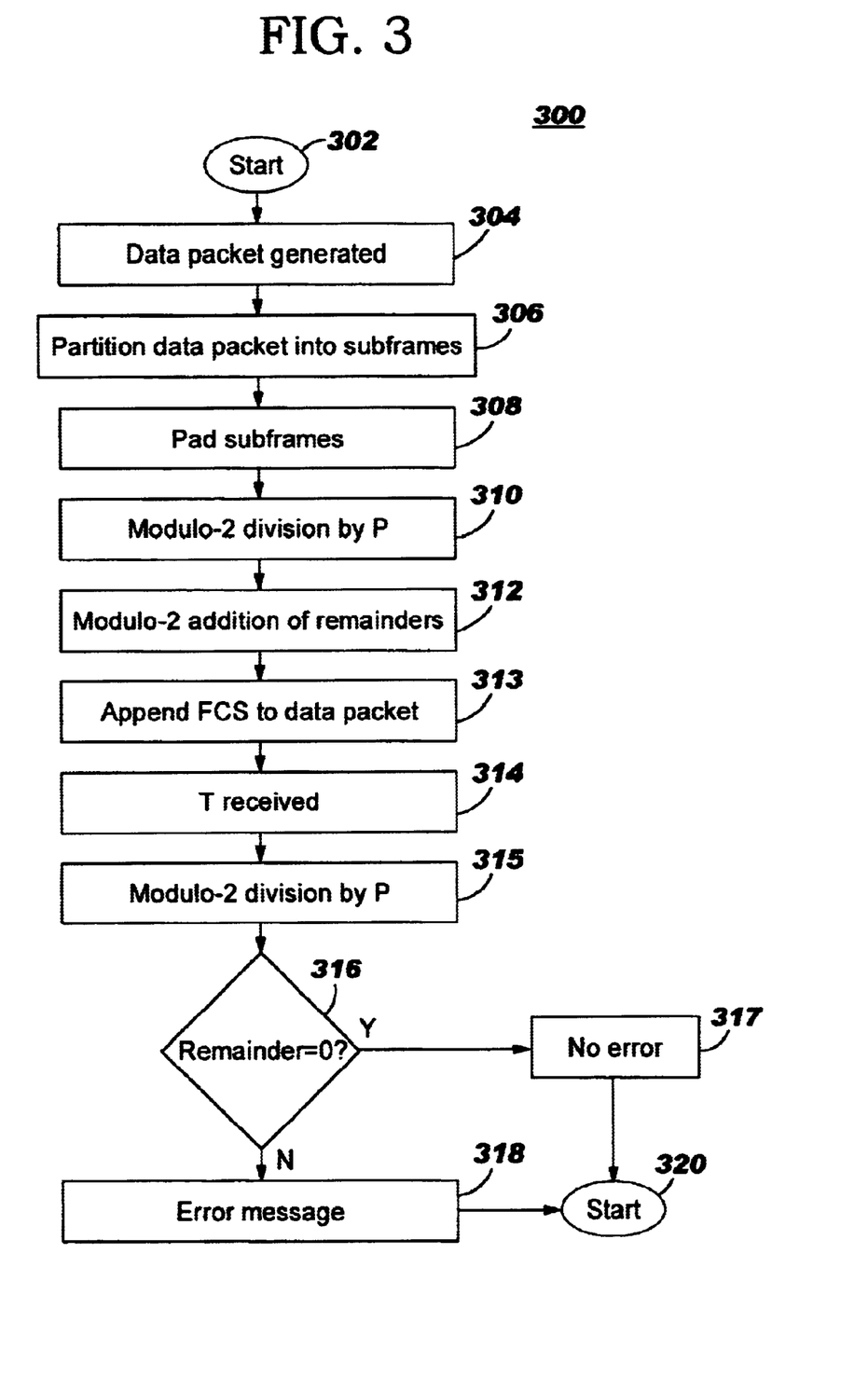
FIG. 3 is a high level logic diagram depicting computation of a FCS in accordance with the teachings of the present invention.

FIG. 3 is a high level logic diagram depicting a FCS computation methodology 300 in accordance with the teachings of the present invention. Methodology 300 commences at start step 302 which depicts commencement of a process for generating a FCS for a newly generated or received data packet. The method proceeds to step 304 which illustrates reception of a data packet at the node at which methodology 300 is performed. In accordance with CRC convention, a previously generated FCS will be attached to the received data packet.

Next, the data packet is partitioned, or parsed, into subframes as depicted at step 306. A preferred method of such parsing is illustrated with reference to data packet 200 and subframes 202, 204, 206, and 208 of FIG. 2 and also Appendix A. Thereafter, and as illustrated at step 308, the subframes are padded with zeros or some other suitable uniform value such that each subframe achieves the dimensions of the original data frame received at step 304. Modulo-2, no carries division is then performed on each subframe utilizing a common divisor such as CRC-32 as depicted at step 310. Each such division will result in a remainder, or "partial FCS" corresponding to each padded subframe. Next, as illustrated at step 312, the remainders are added together utilizing modulo-2, no carries arithmetic to obtain the FCS for the complete data packet.

Steps 313 through 320 depict a sub-process within methodology 300, in which the FCS may be verified upon receipt following delivery to a destination node. In accordance with conventional CRC methodologies, and as illustrated at step 313, the FCS is appended to the original data packet to form a transmission packet, T. Step 314 depicts reception of T at a destination node which subsequently performs a CRC check (steps 315 through 320) to verifying integrity of the transmission. In accordance with convention CRC methods, the verification performed as illustrated at step 315 is essentially a modulo-2, no carries division of T by the original common divisor, P. If an invalid result (non-zero) is detected at step 316, an error will be posted and an error signal indicating the need to retransmit the data packet will be posted by the receiving node.

It should be noted that the present invention provides a method of obtaining the FCS that is impervious to the sequential order in which the subframes are sent or received. The present invention is therefore adaptable to systems which utilize multiple, regularly interleaved data streams such as ATM. The capability to asynchronously complete the CRC calculation from partial results is a key feature of the present invention. The subframes must be collected and each divided by a common divisor P. The four remainders are then added together to construct the CRC for the complete data packet. The CRC is then appended to the data packet to form a complete frame, T, which is then transmitted to a receiver. Upon receipt of T, the receiver will verify correct transmission by dividing T by the common divisor and if the remainder is zero, transmission has been verified as error free. It should be noted that although computation methodology 300 as well as the supporting description in Appendix A describe computing a FCS for a data packet partitioned in four parts, the method and system of the present invention as described herein is applicable to a data packet partitioned by any integer greater than one.

The present invention utilizes the inherent flexibility of modulo-2 arithmetic (no carries addition and subtraction) to provide a method and system for computing a FCS for an entire data packet utilizing modulo-2 operations performed on subframes of the packet. Because the FCS derived from the subframes is the same as that obtained by conventional computations, the present invention may be seamlessly incorporated into existing CRC systems.

It is important to note that, while the present invention has been, and will continue to be, described in the context of a fully functional telecommunications subsystem, those skilled in the art will appreciate that the present invention is capable of being distributed as a program product in a variety of forms, and that the present invention applies equally regardless of the particular type of signal-bearing media utilized to actually carry out the distribution. Examples of signal-bearing media include: recordable-type media, such as floppy disks, hard disk drives, and CD ROMs, and transmission-type media such as digital and analog communication links.

Preferred implementations of the invention include implementations as a computer system programmed to execute the method or methods described herein, and as a program product. According to the computer system implementation, sets of instructions for executing the method and methods are resident in RAM of one or more computer systems configured generally as described above. Until required by the computer system, the set of instructions may be stored as a computer-program product in another computer memory, for example, in a disk drive (which may include a removable memory such as an optical disk or floppy disk for eventual utilization in disk drive).

The computer-program product can also be stored at another computer and transmitted when desired to the user's workstation by a network or by an external communications network. One skilled in the art can appreciate that the physical storage of the sets of instructions physically changes the medium upon which it is stored so that the medium carries computer-readable information. The change may be electrical, magnetic, chemical, or some other physical change. While it is convenient to describe the invention. in terms of instructions, symbols, characters, or the like, the reader should remember that all of these and similar terms should be associated with the appropriate physical elements. Thus, a method for implementing the present invention as depicted in FIG. 3, can be accomplished with a computer-aided device. In such a method, data stored in a memory unit of a data-processing system such as a data-processing system, can represent steps in a method for implementing a preferred embodiment of the present invention.

Figure 4:
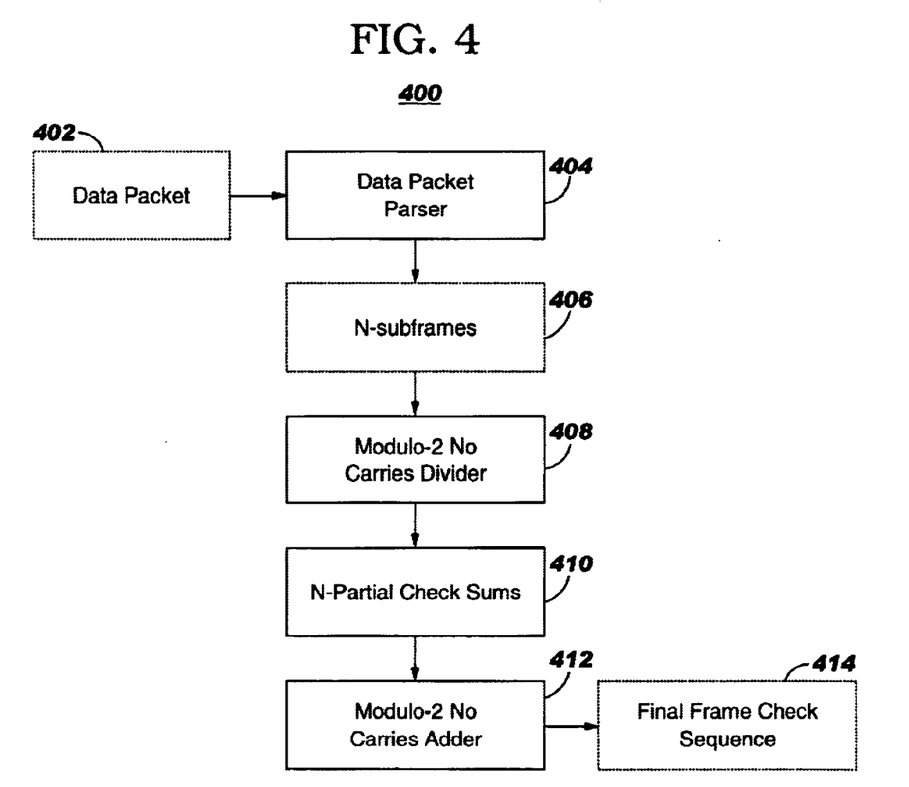
FIG. 4 is a simplified block diagram illustrating the functional entities comprising one embodiment of the CRC generator of the present invention.

With reference now to FIG. 4 there is illustrated a simplified block diagram illustrating the functional entities comprising one embodiment of the CRC generator of the present invention. Block 402 represents a data packet similar to data packet 200 of FIG. 2. The data packet depicted at block 402 is delivered to a parser, illustrated at block 404. Although not explicitly depicted in FIG. 4, in accordance with conventional CRC techniques (described in further detail in Stallings pp. 164–171), k zero-bits are appended to the data packet prior to the packet being delivered to the parser. As explained with reference to FIGS. 2 and 3, the data packet is then parsed in a regularly interleaved manner into a predetermined number, N, of subframes 406. In general for a data packet having M total bits that is to be partitioned into N subframes, each subframe will be composed of a unique set of M/N bits. For example, if, as depicted in FIG. 2 and Appendix A, the number of subframes has been determined to be four, the parser depicted at block 404 will parse out every fourth bit starting, for example with the first. This subframe will thus be comprised of the first, fifth, ninth, thirteenth, seventeenth, etc. bits in order to construct one subframe. Similarly, the next subframe will be .constructed from the second, sixth, tenth, fourteenth, etc. bits and so on for the remaining two subframes.

Subframes 406 are then padded with zeros as illustrated at step 203 of FIG. 2 and Appendix A and delivered to a divider depicted at block 408. As shown in bock 408, the divider performs modulo-2, no carries division on each of the padded subframes. For each such division operation, the dividend is the padded subframe, and, in accordance with conventional CRC techniques (See Stallings pp. 164–171), the divisor is a predetermined common divisor, comprised of k+1 bits. The remainder from the modulo-2, no carries division of subframe i by P will be utilized as the "partial check sum" for subframe i. After all N of such partial check sums 410 have been computed, they are added together within a modulo-2, no carries adder, or its functional equivalent illustrated at block 412. The sum of all N partial check sequences is the final frame check sequence 414 that is then associated with and appended to data packet 402.

While the invention has been particularly shown as described with reference to a preferred embodiment, it will be understood by those skilled in the art that various changes in form and detail may be made therein without departing from the spirit and scope of the invention. It is therefore contemplated that such modifications can be made without departing from the spirit or scope of the present invention as defined in the appended claims.

APPENDIX A

This appendix sets forth a general method of deriving a Frame Check Sequence (FCS) in accordance with the method and system of the present invention.

Modulo-2 addition with no carries is distributive, that is, $x*(y+z)=x*y+x*z$. Let a, b, c, and d be any four binary numbers, and let P be any nonzero divisor. Dividing P into a yields a quotient Q(a) and a remainder R(a). Thus $a=Q(a)*P+R(a)$. Similarly, dividing P into b, c, and d, and designating F to be the sum a+b+c+d:

$$F=Q(a)*P+R(a)+Q(b)*P+R(b)+Q(c)*P+R(c)+Q(d)*P+R(d) \quad (1)$$

Thus, $$R(F/P)=R(a)+R(b)+R(c)+R(d) \quad (2)$$

Substituting padded subframes for a, b, c, and d in this example, a set of four remainders will be obtained. The four remainders that result from each division are then added together to obtain the FCS for data packet 200. That is, suppose a full frame:

$$a_n b_n c_n d_n a_{n-1} b_{n-1} c_{n-1} \ldots a_2 b_2 c_2 d_2 a_1 b_1 c_1 d_1$$

is partitioned as:

$a_n 000 a_{n-1} 000 a_{n-2} 000 \ldots a_2 000 a_1 000 +$
$0 b_n 000 b_{n-1} 000 b_{n-2} 00 \ldots 0 b_2 000 b_1 00 +$
$00 c_n 000 c_{n-1} 000 c_{n-2} 0 \ldots 00 c_2 000 c_1 0 +$
$000 d_n 000 d_{n-1} 000 d_{n-2} \ldots 000 d_2 000 d_1,$ which, for illustrative purposes may be labelled as subframes $S_a$, $S_b$, $S_c$, and $S_d$ respectively. In accordance. with the relation depicted in equation (2):

$$FCS = R[a_n b_n c_n d_n a_{n-1} b_{n-1} c_{n-1} d_{n-1} \ldots a_2 b_2 c2 d_2 a_1 b_1 c_1 d_1]$$
$$= R[S_a + S_b + S_c + S_d]$$
$$= R[S_a] + R[S_b] + R[S_c] + R[S_d]$$

Thus the FCS for data packet 200 may be obtain in this manner from subframes 202, 204, 206, and 208. The process of CRC computation is thus modified by partitioning the data packet in a manner consistent with subframes 202, 204, 206, and 208.

What is claimed is:

1. A method for generating a frame check sequence for a data packet, wherein said data packet is composed of a string of binary bits, said method comprising the steps of:
    parsing said data packet into M subframes each containing at least N bits and no more than N+1 bits that are interleaved at regular intervals with bits contained within the other M−1 subframes;
    computing a partial check sum for each of said M subframes; and
    adding each of said partial check sums such that a frame check sequence for said data packet is obtained.

2. The method of claim 1, wherein said step of parsing said data packet is preceded by the step of appending k zero-bits to said data packet, where k is an integer greater than zero.

3. The method of claim 2, wherein said step of computing a partial check sum for said M subframes further comprises the steps of:
    utilizing modulo-2 no-carries arithmetic to divide an $i^{th}$ one of said M subframes by a common divisor, P, wherein P is a k+1 bit binary number; and
    in response to said modulo-two division, obtaining a remainder, $R_i$, wherein $R_i$ is utilized as a partial check sum associated with said $i^{th}$ subframe.

4. The method of claim 1, wherein said step of parsing said data packet is followed by the step of padding said M subframes with zero bits at bit positions corresponding to said regular interleaved positions of said bits contained within the other M−1 subframes to form padded subframes.

5. The method of claim 1, wherein said step of adding each of said partial check sums further comprises utilizing modulo-2 no-carries arithmetic to add each of said partial check sums to generate a frame check sequence associated with said data packet.

6. A system for verifying the integrity of transmission of a data frame composed of a string of binary bits, said system comprising:
    data processing means for parsing said data frame into M subframes each containing at least N bits and no more than N+1 bits that are interleaved at regular intervals with bits contained within the other M−1 subframes;
    means for computing a partial check sum for each of said M subframes; and
    a modulo-2 no carries adder for adding said partial check sums such that a frame check sequence for said data frame is obtained.

7. The system of claim 6, wherein said data processing means for parsing said data packet further comprises data processing means for appending k zero-bits to said data packet.

8. The system of claim 7, wherein said computation means for computing a partial check sum for said M subframes further comprises:
    a modulo-2 no-carries divider for dividing an $i^{th}$ one of said M subframes by a common divisor, P, wherein P is a k+1 bit binary number.

9. The system of claim 6, wherein said data processing means for parsing said data packet further comprises data processing means for padding said M subframes with zero bits at bit positions corresponding to said regular interleaved positions of said bits contained within the other M−1 subframes to form padded subframes.

10. A program product stored in signal bearing media for generating a frame check sequence for a data packet, wherein said data packet is composed of a string of binary bits, said program product comprising:

instruction means for parsing said data packet into M subframes each containing at least N bits and no more than N+1 bits that are interleaved at regular intervals with bits contained within the other M−1 subframes;

instruction means for computing a partial check sum for each of said M subframes; and instruction means for adding each of said partial check sums such that a frame check sequence for said data packet is obtained.

11. The program product of claim 10, wherein said instruction means for parsing said data packet further comprises instruction means for appending k zero-bits to said data packet.

12. The program product of claim 11, wherein said instruction means for computing a partial check sum for said M subframes further comprises:

instruction means for utilizing modulo-2 no-carries arithmetic to divide an $i^{th}$ one of said M subframes by a common divisor, P, wherein P is a k+1 bit binary number; and instruction means responsive to said modulo-two division, for obtaining a remainder, $R_i$, wherein $R_i$ is utilized as a partial check sum associated with said $i^{th}$ subframe.

13. The program product of claim 10, wherein said instruction means for parsing said data packet further comprises instruction means for padding said M subframes with zero bits at bit positions corresponding to said regular interleaved positions of said bits contained within the other M−1 subframes to form padded subframes.

14. The program product of claim 10, wherein said instruction means for adding each of said partial check sums further comprises instruction means for utilizing modulo-2 no-carries arithmetic to add each of said partial check sums to generate a frame check sequence associated with said data packet.

* * * * *